US012650349B2

(12) United States Patent
Heiling et al.

(10) Patent No.: US 12,650,349 B2
(45) Date of Patent: Jun. 9, 2026

(54) TEMPERATURE MEASUREMENT TECHNIQUES FOR BATTERY MANAGEMENT CIRCUITS

(71) Applicant: Infineon Technologies AG, Neubiberg (DE)

(72) Inventors: Christian Heiling, Graz (AT); Heinrich Trebo, Graz (AT); Mario Fuchs, Graz (AT)

(73) Assignee: Infineon Technologies AG, Neubiberg (DE)

( * ) Notice: Subject to any disclaimer, the term of this patent is extended or adjusted under 35 U.S.C. 154(b) by 482 days.

(21) Appl. No.: 18/311,758

(22) Filed: May 3, 2023

(65) Prior Publication Data

US 2024/0369423 A1 Nov. 7, 2024

(51) Int. Cl.
*G01K 7/16* (2006.01)
*G01R 19/25* (2006.01)
(Continued)

(52) U.S. Cl.
CPC ........... *G01K 7/16* (2013.01); *G01R 19/2503* (2013.01); *G01R 31/007* (2013.01);
(Continued)

(58) Field of Classification Search
CPC ........ G01K 7/16; G01K 7/24; G01K 2219/00; G01R 19/2503; G01R 31/007;
(Continued)

(56) References Cited

U.S. PATENT DOCUMENTS 4,709,202 A * 11/1987 Koenck ................... H02J 7/977
320/152
6,137,280 A * 10/2000 Ackermann ............ H02J 7/445
324/426

(Continued)

OTHER PUBLICATIONS

"TLE9012DQU Li-Ion battery monitoring and balancing IC", Infineon Technologies AG, Retrieved from: https://www.infineon.com/cms/en/product/battery-management-ics/tle9012dqu/, Jan. 24, 2022, 76 pp.

*Primary Examiner* — Laura Martin
*Assistant Examiner* — Philip L Cotey
(74) *Attorney, Agent, or Firm* — Shumaker & Sieffert, P.A.

(57) ABSTRACT

In some examples, this disclosure describes a method of measuring a temperature-dependent voltage drop over a temperature sensitive resistor. The method may comprise delivering a reference voltage to the temperature sensitive resistor in a first instance of time; determining an auto-ranging current through the temperature sensitive resistor while the reference voltage is delivered to the temperature sensitive resistor; determining a temperature measurement current based on the auto-ranging current; delivering the temperature measurement current to the temperature sensitive resistor in a second instance of time, wherein the second instance of time is after the first instance of time; and measuring the temperature-dependent voltage drop over the temperature sensitive resistor while the temperature measurement current is delivered to the temperature sensitive resistor.

14 Claims, 7 Drawing Sheets

(51) Int. Cl.

| | |
|---|---|
| *G01R 31/00* | (2006.01) |
| *G01R 31/382* | (2019.01) |
| *H01M 10/48* | (2006.01) |
| *H02J 7/00* | (2026.01) |
| *G01K 7/24* | (2006.01) |
| *H01M 10/44* | (2006.01) |
| *H02J 7/90* | (2026.01) |

(52) U.S. Cl.

CPC ........ *G01R 31/382* (2019.01); *H01M 10/486* (2013.01); *H02J 7/00* (2013.01); *G01K 7/24* (2013.01); *G01K 2219/00* (2013.01); *H01M 10/443* (2013.01); *H02J 7/977* (2026.01)

(58) Field of Classification Search

CPC ............ G01R 31/382; H01M 10/486; H01M 10/443; H02J 7/00; H02J 7/007194

See application file for complete search history.

(56) References Cited

U.S. PATENT DOCUMENTS

| | | | | |
|---|---|---|---|---|
| 8,935,011 | B2* | 1/2015 | Tischer ..................... | H02J 7/50 |
| | | | | 700/297 |
| 10,345,384 | B2* | 7/2019 | Christophersen .... | G01R 31/382 |
| 2009/0110028 | A1* | 4/2009 | Goh ......................... | G01K 7/16 |
| | | | | 374/185 |
| 2015/0015190 | A1* | 1/2015 | Tischer ..................... | H02J 7/50 |
| | | | | 320/152 |
| 2015/0103868 | A1* | 4/2015 | Vu ........................... | G01K 7/22 |
| | | | | 374/183 |
| 2016/0261127 | A1* | 9/2016 | Worry .............. | H01M 10/4207 |
| 2018/0209854 | A1* | 7/2018 | Feldman .............. | G01K 13/20 |
| 2019/0339730 | A1* | 11/2019 | Coln ....................... | G05F 1/575 |
| 2020/0271728 | A1* | 8/2020 | Chen ................. | G01R 31/3835 |
| 2022/0214228 | A1* | 7/2022 | Shibata .................. | G01K 7/25 |
| 2022/0364936 | A1* | 11/2022 | Horng ...................... | G01K 7/01 |
| 2023/0037712 | A1* | 2/2023 | Singh ................. | G01R 21/127 |
| 2023/0121535 | A1* | 4/2023 | Jue ........................... | H03H 7/06 |
| | | | | 374/183 |

* cited by examiner

This extra resistor is part of the regulation loop, which in some examples serves to pull down the regulation voltage

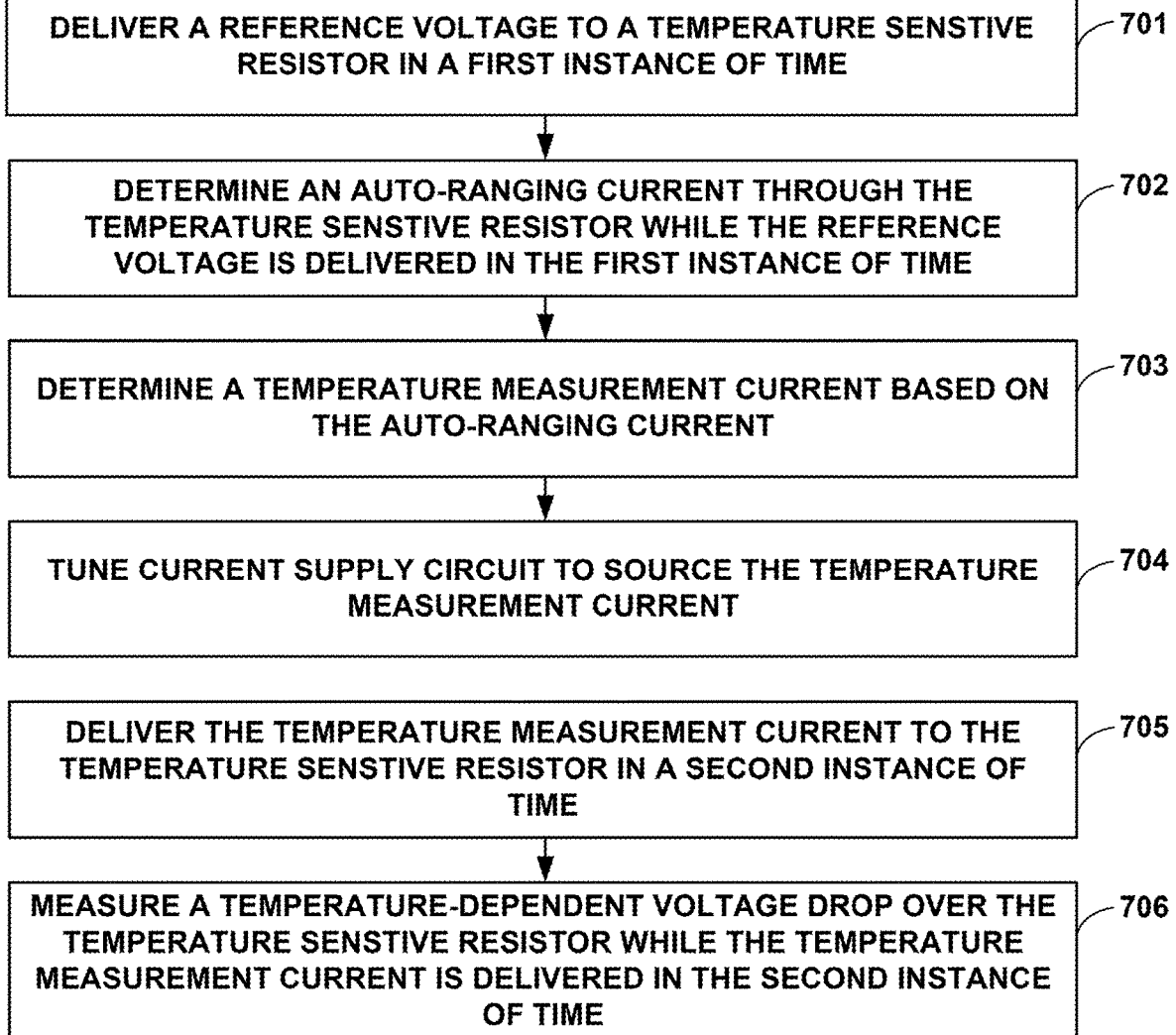

DELIVER A REFERENCE VOLTAGE TO A TEMPERATURE SENSTIVE RESISTOR IN A FIRST INSTANCE OF TIME ⸺701

DETERMINE AN AUTO-RANGING CURRENT THROUGH THE TEMPERATURE SENSTIVE RESISTOR WHILE THE REFERENCE VOLTAGE IS DELIVERED IN THE FIRST INSTANCE OF TIME ⸺702

DETERMINE A TEMPERATURE MEASUREMENT CURRENT BASED ON THE AUTO-RANGING CURRENT ⸺703

TUNE CURRENT SUPPLY CIRCUIT TO SOURCE THE TEMPERATURE MEASUREMENT CURRENT ⸺704

DELIVER THE TEMPERATURE MEASUREMENT CURRENT TO THE TEMPERATURE SENSTIVE RESISTOR IN A SECOND INSTANCE OF TIME ⸺705

MEASURE A TEMPERATURE-DEPENDENT VOLTAGE DROP OVER THE TEMPERATURE SENSTIVE RESISTOR WHILE THE TEMPERATURE MEASUREMENT CURRENT IS DELIVERED IN THE SECOND INSTANCE OF TIME ⸺706

FIG. 7

TEMPERATURE MEASUREMENT TECHNIQUES FOR BATTERY MANAGEMENT CIRCUITS

TECHNICAL FIELD

This disclosure relates to battery management circuits for electric vehicles or other battery powered devices, and more specifically, techniques and circuits for measuring battery cell temperatures.

BACKGROUND

Battery powered devices, such as electric vehicles, often include many battery cells connected in series to form a battery system for the battery powered device. For such battery systems, battery management systems (BMSs) are often used for battery cell monitoring, thermal monitoring, block balancing of different sets of battery cells, or other battery management functions.

High voltage BMSs, such as those used for electric vehicles, often use several different battery management circuits in order to monitor all of the battery cells of a battery powered device. For example, each of the battery management circuits may monitor a subset of the battery cells of a battery system that is used to provide power to a battery powered device. Battery management circuits may be used to monitor voltages and temperatures of individual battery cells, and in some cases, may be used to perform cell block balancing functions or other battery management functions.

Measuring the temperature of one or more battery cells is desirable for battery management circuits, e.g., as part of thermal monitoring or other battery cell management functions.

SUMMARY

This disclosure is directed to circuits and techniques for measuring temperature associated with one or more elements, e.g., the temperature associated with one or more battery cells in a battery management system (BMS). The techniques and circuits make use of a temperature sensitive resistor, and the techniques and circuits measure a temperature-dependent voltage drop over the temperature sensitive resistor to identify a temperature.

More specifically, this disclosure describes techniques for determining an auto-ranging current through the temperature sensitive resistor, which may be defined using a predefined reference voltage. Then, a temperature measurement current can be defined or determined based on the determined auto-ranging current through the temperature sensitive resistor. By determining the temperature measurement current based on an auto-ranging current, the techniques and circuits can be improved.

In some examples, this disclosure describes a temperature measurement circuit configured to measure a temperature-dependent voltage drop over a temperature sensitive resistor. The temperature measurement circuit may comprise a reference voltage supply circuit configured to supply a reference voltage; a current source configured to supply a temperature measurement current; and a switch circuit configured to select between the reference voltage supply circuit and the current source. The temperature measurement circuit may be configured to: control the switch circuit to deliver the reference voltage to the temperature sensitive resistor; determine an auto-ranging current through the temperature sensitive resistor while the reference voltage is delivered to the temperature sensitive resistor; determine the temperature measurement current based on the auto-ranging current; control the switch circuit to deliver the temperature measurement current to the temperature sensitive resistor; and measure the temperature-dependent voltage drop over the temperature sensitive resistor while the temperature measurement current is delivered to the temperature sensitive resistor.

In some examples, this disclosure describes a method of measuring a temperature-dependent voltage drop over a temperature sensitive resistor. The method may comprise delivering a reference voltage to the temperature sensitive resistor in a first instance of time; determining an auto-ranging current through the temperature sensitive resistor while the reference voltage is delivered to the temperature sensitive resistor; determining a temperature measurement current based on the auto-ranging current; delivering the temperature measurement current to the temperature sensitive resistor in a second instance of time, wherein the second instance of time is after the first instance of time; and measuring the temperature-dependent voltage drop over the temperature sensitive resistor while the temperature measurement current is delivered to the temperature sensitive resistor.

In some examples, this disclosure describes a system comprising: a plurality of battery cells; and a plurality of battery management circuits configured to manage different subsets of the plurality of battery cells, wherein each of the battery management circuits includes one or more temperature measurement circuits, and wherein each of the temperature measurement circuits is configured to measure a temperature-dependent voltage drop over a temperature sensitive resistor. Each of the temperature measurement circuits may comprise a reference voltage supply circuit configured to supply a reference voltage; a current source configured to supply a temperature measurement current; and a switch circuit configured to select between the reference voltage supply circuit and the current source. Moreover, each of the temperature measurement circuits may be configured to: control the switch circuit to deliver the reference voltage to the temperature sensitive resistor; determine an auto-ranging current through the temperature sensitive resistor while the reference voltage is delivered to the temperature sensitive resistor; determine the temperature measurement current based on the auto-ranging current; control the switch circuit to deliver the temperature measurement current to the temperature sensitive resistor; and measure the temperature-dependent voltage drop over the temperature sensitive resistor while the temperature measurement current is delivered to the temperature sensitive resistor.

Details of these and other examples are set forth in the accompanying drawings and the description below. Other features, objects, and advantages will be apparent from the description and drawings, and from the claims.

BRIEF DESCRIPTION OF DRAWINGS

FIG. 7 is a flow diagram consistent with techniques of this disclosure.

DETAILED DESCRIPTION

This disclosure is directed to circuits and techniques for measuring temperature associated with one or more elements within a circuit. The techniques and circuits may be useful in battery management circuits, e.g., to determine temperatures associated with one or more battery cells, or the techniques and circuits may be used in other situations or settings. The techniques and circuits make use of a temperature sensitive resistor and measure a temperature-dependent voltage drop over the temperature sensitive resistor to identify a temperature. According to this disclosure, a temperature measurement current used for the temperature sensitive resistor is defined in a manner that can improve the techniques and circuits.

In particular, this disclosure describes techniques for determining an auto-ranging current through the temperature sensitive resistor, which may be defined using a pre-defined reference voltage. Then, a temperature measurement current can be determined based on the determined auto-ranging current through the temperature sensitive resistor.

A switch circuit can be used to select between a reference voltage supply circuit and a current source. Upon selecting the reference voltage supply circuit, the reference voltage supply circuit can deliver the pre-defined reference voltage to the temperature sensitive resistor and cause the auto-ranging current through the temperature sensitive resistor. Then, the current source can be properly tuned to source a temperature measurement current that is defined based on the determined auto-ranging current. The switch circuit then selects the current source, and the defined temperature measurement current is delivered to the temperature sensitive resistor. The circuit measures the temperature-dependent voltage drop over the temperature sensitive resistor while the temperature measurement current is delivered to the temperature sensitive resistor, which can provide an indication of temperature. By defining the temperature measurement current based on an auto-ranging current, the techniques and circuits can be improved, e.g., producing faster and more accurate temperature measurements and reducing settling time associated with the current measurement.

Battery management circuits may be configured to monitor charge levels (e.g., cell voltage levels) and temperatures of several different battery cells, and these circuits may be configured to perform cell balancing or other battery management functions within a battery management system (BMS). A BMS associated with an electric device, such as an electric vehicle, may include several battery management circuits in order to monitor different subsets of a plurality of battery cells used by the electric device. In some examples, the techniques of this disclosure can improve the temperature measurements associated with battery cell monitoring in a BMS.

Figure 1:
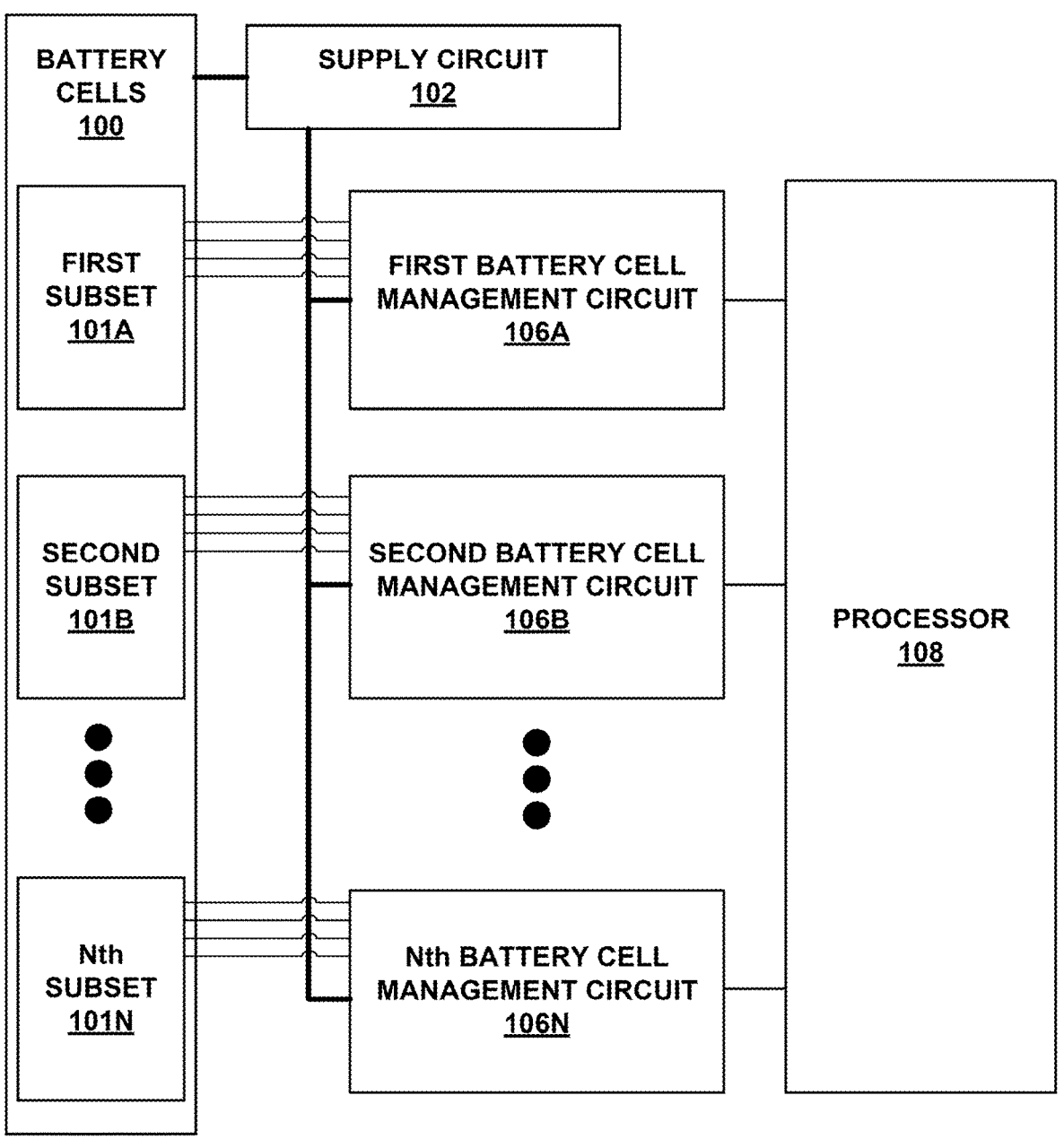
FIG. 1 is a block diagram battery cells and a battery monitoring system (BMS) that includes a supply circuit, a processor, and a plurality of battery cell management circuits.

FIG. 1 is a block diagram showing battery cells and a BMS that includes a supply circuit 102 and battery management circuits 106A, 106B, 106N to monitor battery cells 100. Battery cells 100 may comprise a set of battery cells connected in series. In order to monitor battery cells, supply circuit 102 uses power from battery cells 100 (or another power supply) to supply electrical current to battery management circuits 106A, 106B, 106N so that battery management circuits 106A, 106B, 106N can monitor each, measuring battery cell temperatures, or other battery cell management functions. Each of battery management circuits 106A, 106B, 106N may be configured and arranged to monitor a different subset of battery cells. For example, as illustrated in FIG. 1, a first battery management circuit 106A is arranged to monitor a first subset 101A of battery cells 100, a second battery management circuit 106B is arranged to monitor a second subset 101B of battery cells 100, and an Nth subset 101N is arranged to monitor an Nth subset 101N of battery cells 100. In this example, N may represent any integer greater than 2. In other words, a BMS may include any number of battery cells and any number of battery cell management circuits.

Battery management circuits 106A, 106B, 106N may be connected to a processor 108, e.g., an external microprocessor. Processor 108 may comprise a BMS-level processor, or possibly a higher system-level processor of an electric vehicle or other device. In some examples, processor 108 may operate in a low voltage domain (e.g., 12 or 18 volts) and battery cells 100 and battery management circuits 106A, 106B, 106N may operate in a high voltage domain (e.g., greater than 300 volts). In this case, a galvanic isolation barrier may exist between processor 108 and battery management circuits 106A, 106B, 106N to protect processor 108 from the high voltage domain. The galvanic isolation barrier may comprise an electrical transformer, such as stacked coils formed on printed circuit board, or a so-called coreless transformer. In other examples, galvanic isolation barrier may comprise one or more capacitors arranged to provide galvanic isolation to the different sides of the capacitors. Other galvanic isolation techniques may also be used. In any case, control signals can be sent across the galvanic isolation barrier from processor 108 to battery management circuits 106A, 106B, 106N.

Each of battery cell management circuits 106A, 106B, 106N may include one or more circuits configured to measure the temperature associated with one or more battery cells within the respective subset 101A, 101B, 101N of cells managed by a respective battery cell management circuit 106A, 106B, 106N. In some cases, one temperature measurement resistor and circuit can apply to each subset 101A, 101B, 101N of cells, and in other cases, a plurality of temperature measurement resistors and circuits are used for each subset 101A, 101B, 101N. One temperature sensitive resistor (not shown in FIG. 1), for example, may correspond to each cell of battery cells 100, or one temperature sensitive resistor may correspond to two or more of the battery cells 100. Each temperature sensitive resistor, for example, may be placed in close spatial proximity to the cell or cells being thermally monitored by that temperature sensitive resistor.

As described in greater detail below, a temperature measurement circuit may be configured to measure a temperature-dependent voltage drop over a temperature sensitive resistor. Each of battery cell management circuits 106A, 106B, 106N may include one or more of the temperature measurement circuits described herein, e.g., for monitoring the temperature associated with one or more battery cells.

Figure 2:
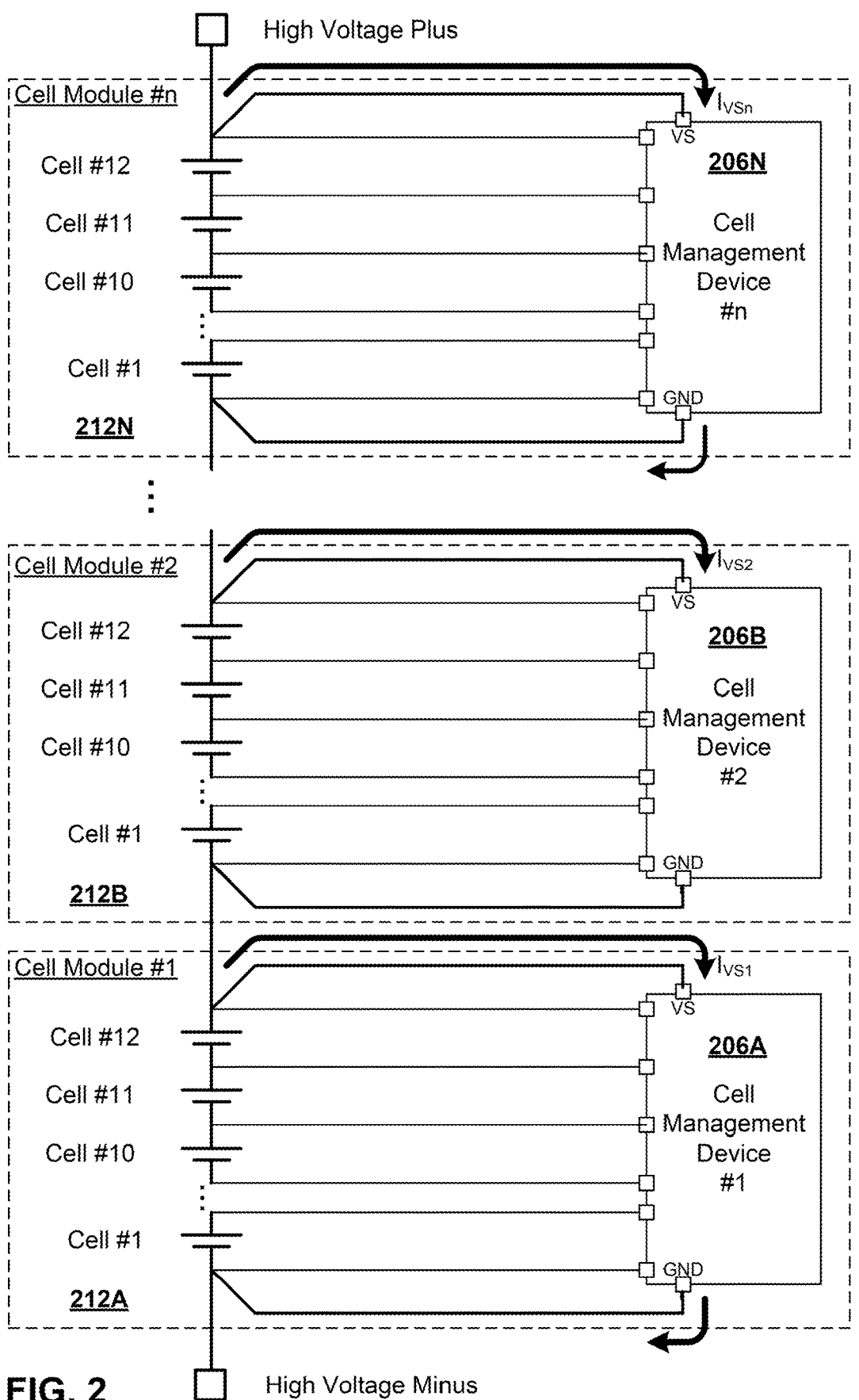
FIG. 2 is a block diagram showing a plurality of battery cell modules that each include a battery cell management device.

FIG. 2 is a block diagram showing a plurality of battery cell modules that each include a battery cell management device. FIG. 2 is consistent with the example shown in FIG. 1. In this case, each battery cell management device is paired with a subset of battery cells within a battery module. In particular, FIG. 2 shows a first battery cell management device 206A associated with twelve battery cells in a first cell module 212A. FIG. 2 also shows a second battery cell management device 206B associated with twelve battery cells in a second cell module 212B, and a third battery cell management device 206N associated with twelve battery cells in a third cell module 212N. The variable "n" shown in FIG. 2 for cell management device 206N may be any integer greater than n=2. In other words, a BMS like that shown in FIG. 2 may include any number of battery cell management circuits.

A battery cell management circuit (such as battery management circuit 106A, 106B, 106N or cell management device 206A, 206B, 206N) may be configured to manage a plurality of battery cells (e.g., a subset of cells in a larger battery system). According to this disclosure, the battery cell management circuit (e.g., battery management circuit 106A, 106B, 106N or cell management device 206A, 206B, 206N) may comprise one or more temperature measurement circuits for monitoring the temperature associated with one or more battery cells.

As described in greater detail below, the temperature measurement circuit or circuits within each cell management device 206A, 206B, 206N may comprise a reference voltage supply circuit configured to supply a reference voltage; a current source configured to supply a temperature measurement current; and a switch circuit configured to select between the reference voltage supply circuit and the current source. The temperature measurement circuit may be configured to: control the switch circuit to deliver the reference voltage to the temperature sensitive resistor; determine an auto-ranging current through the temperature sensitive resistor while the reference voltage is delivered to the temperature sensitive resistor; determine the temperature measurement current based on the auto-ranging current; control the switch circuit to deliver the temperature measurement current to the temperature sensitive resistor; and measure the temperature-dependent voltage drop over the temperature sensitive resistor while the temperature measurement current is delivered to the temperature sensitive resistor.

Figure 3:
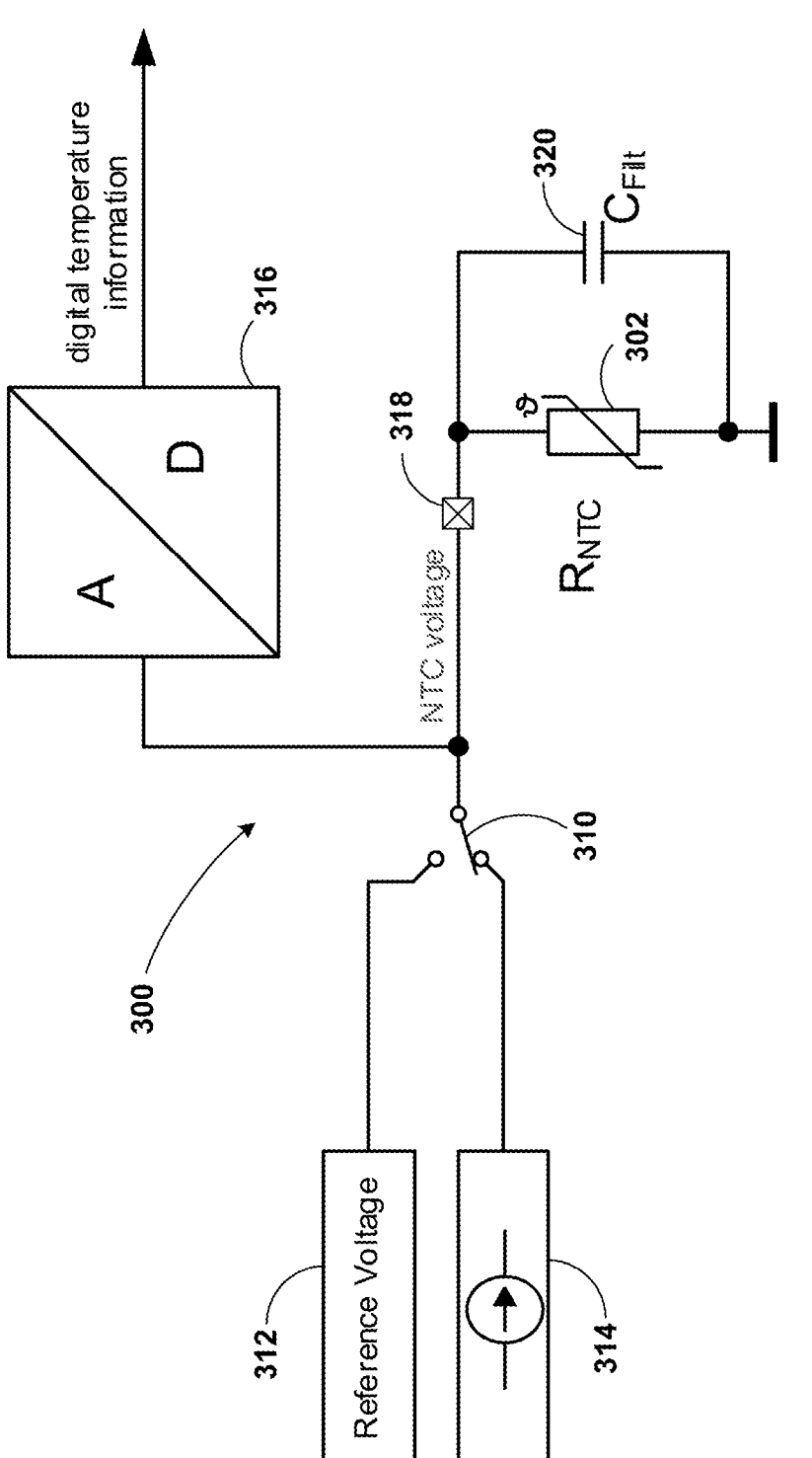
FIG. 3 is a circuit diagram showing an example temperature measurement circuit consistent with this disclosure.

FIG. 3 is a circuit diagram showing an example temperature measurement circuit 300 consistent with this disclosure. Each of battery management circuits 106A, 106B, 106N or cell management devices 206A, 206B, 206N may include one or more temperature measurement circuits like that shown in FIG. 3. In some examples, each of battery management circuits 106A, 106B, 106N or cell management devices 206A, 206B, 206N includes a plurality of temperature measurement circuits like that shown in FIG. 3, e.g., for thermal monitoring of one or more battery cells.

Circuit 300 is one example of a temperature measurement circuit configured to measure a temperature-dependent voltage drop over a temperature sensitive resistor 302. Temperature sensitive resistor 302, for example, may comprise a negative temperature coefficient (NTC) thermistor used to define temperature as a function of its resistance. With known or measurable voltages and currents, the resistance of temperature sensitive resistor 302 can be determined based on Ohms law. In the example shown in FIG. 3, a filtering capacitor (i.e., capacitive filter 320) is positioned in parallel with temperature sensitive resistor 302, which is desirable for many situations and applications. Temperature sensitive resistor 302 and optional capacitive filter 320 may be connected to circuit 300 via a connection pin 318 or other electrical connection.

As shown in FIG. 3, circuit 300 includes a reference voltage supply circuit 312 configured to supply a reference voltage, which may be pre-defined. Circuit 300 also includes a current source 314 configured to supply a temperature measurement current, which can be defined by the process performed by circuit 300. A switch circuit 310 may be configured to select between reference voltage supply circuit 312 and current source 314. For example, circuit 300 may be configured to control switch circuit 310 to deliver a reference voltage from reference voltage supply circuit 312 to temperature sensitive resistor 302 and determine an auto-ranging current through temperature sensitive resistor 302 while the reference voltage from reference voltage supply circuit 312 is delivered to temperature sensitive resistor 302. Circuit 300 can then determine the temperature measurement current based on the auto-ranging current through temperature sensitive resistor 302 while the reference voltage from reference voltage supply circuit 312 is delivered to temperature sensitive resistor 302.

The temperature measurement current, for example, may be set to the auto-ranging current or to an approximation of the auto-ranging current. In some cases, the auto-ranging current can be defined by a current mirror circuit with multiple outputs that is configured to mirror the auto-ranging current. In this case, a particular output of the current mirror may correspond to the temperature measurement current defined by the auto-ranging current. For example, the different outputs may be associated with different multiplication factors such that different outputs are enabled based on the level of the mirrored current. Upon determining the temperature measurement current, circuit 300 may then tune current source 314 to deliver the defined temperature measurement current. Moreover, circuit 300 may control switch circuit 310 to cause current source 314 to deliver the temperature measurement current to temperature sensitive resistor 302, and circuit 300 can measure the temperature-dependent voltage drop over the temperature sensitive resistor 302 while the temperature measurement current is delivered to the temperature sensitive resistor.

As further shown in FIG. 3, circuit 300 includes an analog-to-digital converter (ADC) 316. ADC 316 is one example of a circuit element that can measure the temperature-dependent voltage drop over the temperature sensitive resistor 302 while the temperature measurement current from current source 314 is delivered to temperature sensitive resistor 302. ADC 316 may output a digital value indicative of the temperature-dependent voltage drop, which can be used by a processor or another control circuit for system monitoring, system response, thermal balancing, safety checking, or other reasons.

Again, as noted above, in some cases, the temperature measurement circuit shown in FIG. 3 comprises a battery cell management circuit (e.g., a portion of a battery cell management circuit), and in this case, temperature sensitive resistor 302 may be associated with one or more battery cells of the battery cell management circuit.

Figure 4:
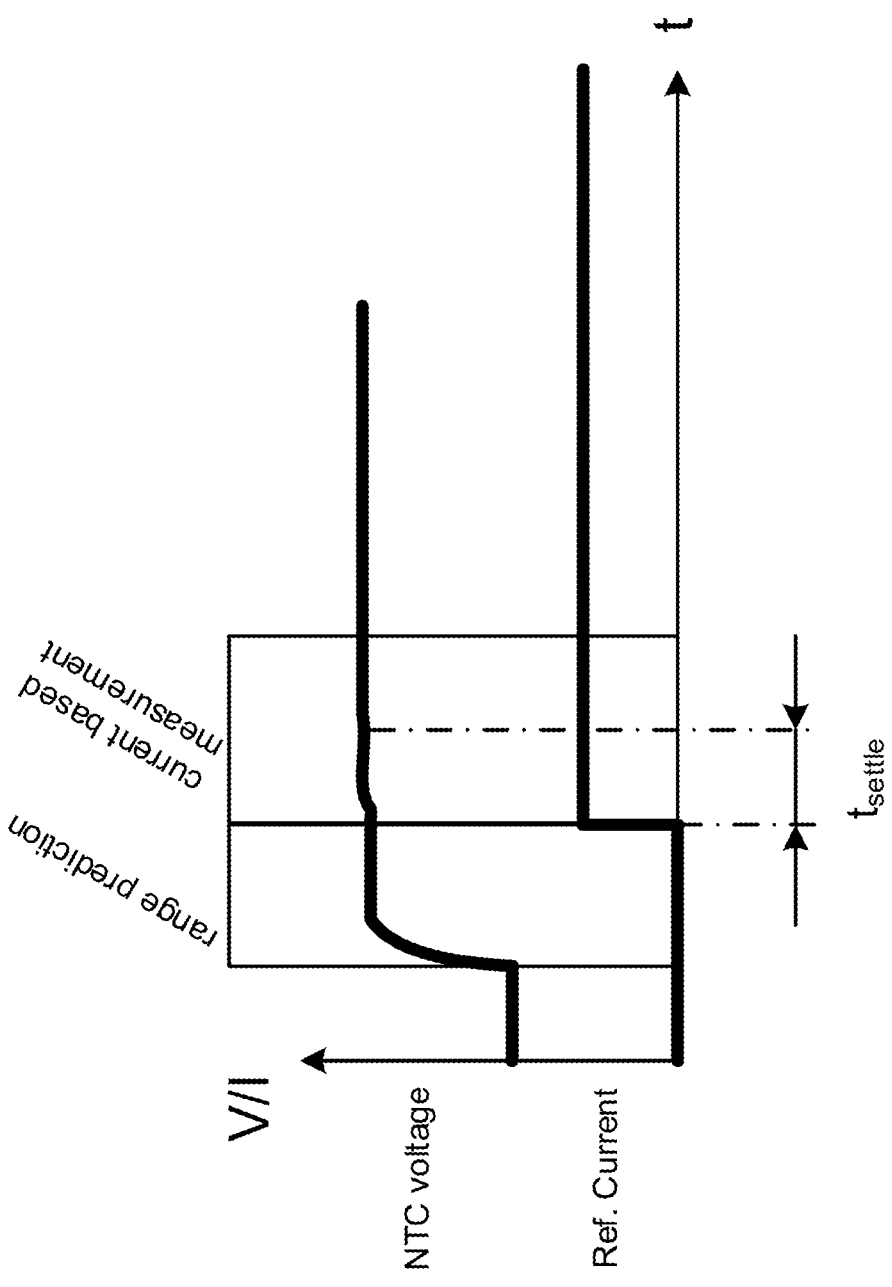
FIG. 4 is a graph showing an example two-step auto-ranging temperature measurement process consistent with this disclosure.

FIG. 4 is a graph showing an example two-step auto-ranging temperature measurement process consistent with this disclosure. The first step may comprise range prediction. Range prediction refers to the process of delivering a pre-defined NTC voltage to temperature sensitive resistor 302, e.g., from reference voltage supply circuit 312. During range prediction, circuit 300 can measure (e.g., determine or approximate) the "auto-ranging current" through temperature sensitive resistor 302 in order to define a temperature measurement current. Then, current source 314 is tuned with the temperature measurement current, and switch circuit 310 selects current source 314, which starts the second step of the process. The second step of the process is referred to as the current based measurement. In some cases, the current based measurement occurs after a settling time ($t_{settle}$). For the current based measurement, ADC 316 may measure the temperature-dependent voltage drop over the temperature sensitive resistor 302 while the temperature measurement current from current source 314 (e.g., that defined in the range prediction step) is delivered to temperature sensitive resistor 302. ADC 316 may then output a digital value indicative of the temperature-dependent voltage drop. The output from ADC 316 can define resistance of temperature sensitive resistor 302 based on Ohms law, since both the temperature measurement current from current source 314 and the voltage drop over temperature sensitive resistor 302 are known values. The resistance, in turn, can be mapped to a temperature, e.g., via a lookup table or one or more equations applied by a processor.

By defining the temperature measurement current based on an auto-ranging current in the range prediction step, the techniques and circuits can be improved. In some examples, the techniques described herein can produce faster and more accurate temperature measurements, and the techniques may also reduce settling time ($t_{settle}$) with the current measurement. In some examples, range prediction illustrated in FIG. 4 may take only approximately 400-600 microseconds (e.g., 500 approximately microseconds). In some examples, settling time ($t_{settle}$) may only take about 10-50 milliseconds (e.g., 40 milliseconds). Moreover, in some examples, measuring of the current may take less than 100 microseconds.

In general, fast and accurate measurement of the battery cell temperature is a desirable for state-of-the-art battery management systems. The cell temperature may be used in combination with other battery parameters or system parameters for several monitoring and prediction algorithms to determine e.g., the state-of-charge and state-of-health of the battery cells. Furthermore, battery cell temperature may be used to keep the battery cells within their safe-operating-area under all operating conditions.

The cell temperature can be measured using NTC resistors, which are physically placed within a battery pack. Those resistors can be measured by one or more battery management circuits or devices, and a digital representation of the temperature can be provided to a battery management host-controller, e.g., a battery management processor or a system-level processor.

In some NTC evaluation circuits, a reference voltage can be provided to a voltage divider comprising a temperature independent reference resistor and the NTC resistor. The resulting NTC voltage can then be measured using an ADC to generate a digital representation of the actual temperature. The disadvantage of such concepts is that the achievable overall accuracy is strongly dependent on the accuracy (including temperature stability) of the external reference resistor. Moreover, with such a concept the measurement range cannot easily be adjusted to the strongly non-linear behavior of the NTC. In addition, due to the time constant of the R-C combination the settling time of such a system is long and depends on the temperature which influences the resistance of the NTC.

The temperature sensitivity of some temperature sensitive resistors may decrease at higher temperatures (e.g., above 75° C.), which is unfortunately a desirable range of interest for battery management tasks to utilize the full power potential of the batteries while safely maintaining the safe operating area (SOA) of the battery cells.

To overcome the issues described above, this disclosure describes some improved concepts and techniques for the cell temperature measurement. For example, a calibrated current source can be used to generate a voltage drop across the NTC resistor. Moreover, with this concept, no additional external reference device is required. To overcome the strong non-linearity of the NTC resistor, the current source may support different current ranges, which can be selected by the control logic based on the last ADC result.

However, a long settling time may remain problematic and long settling times can lead to an unacceptable long acquisition time. Especially in the context of safety applications (e.g., in compliance to the functional safety standard ISO26262), fault handling time interval of typical automotive battery management applications can be difficult to meet, because a result based digital auto-ranging algorithm can take several steps (measurements with included settling time) to yield a valid measurement result with good accuracy and resolution. Given this limitation, it is desirable to identify a trade-off between acceptable measurement time and accuracy, and the effective number of used measurement ranges needs to be limited to respect maximum measurement times.

In some examples, the techniques of this disclosure may combine the current source-based resistance measurement with a fast voltage-based range prediction feature. The NTC resistance is connected to a reference voltage in a first step and the current that flows at this voltage is measured. Subsequently, the measured current is provided by the configurable current source and the actual voltage drop can be measured precisely with a calibrated ADC. Therefore, only a single measurement step is required to measure the NTC resistance using the desirable current range. Additionally, the settling time is reduced, because the resulting voltage drop is very close to the previously applied reference voltage.

Figure 5:
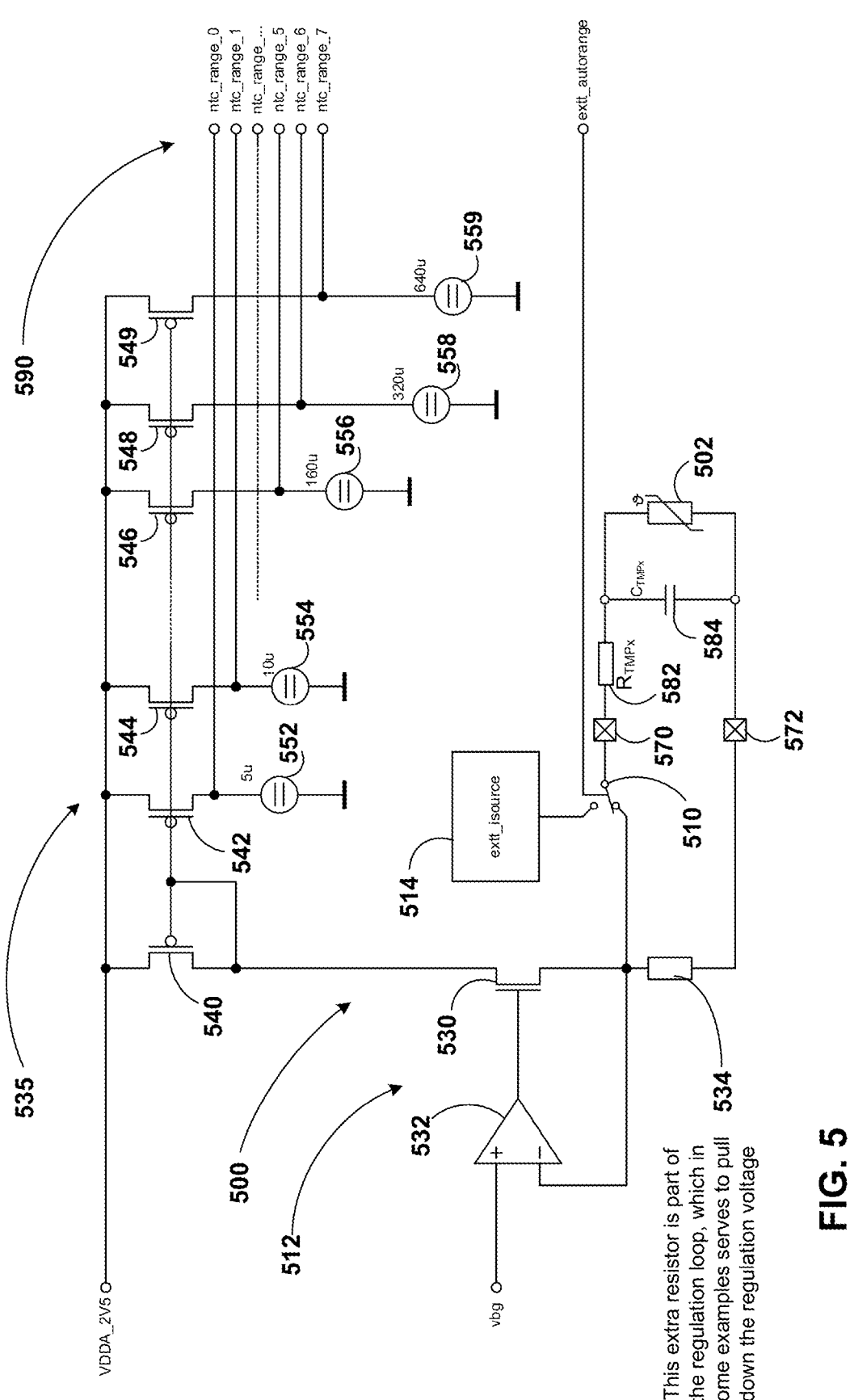
FIGS. 5 and 6 are circuit diagrams consistent with this disclosure.
Figure 6:
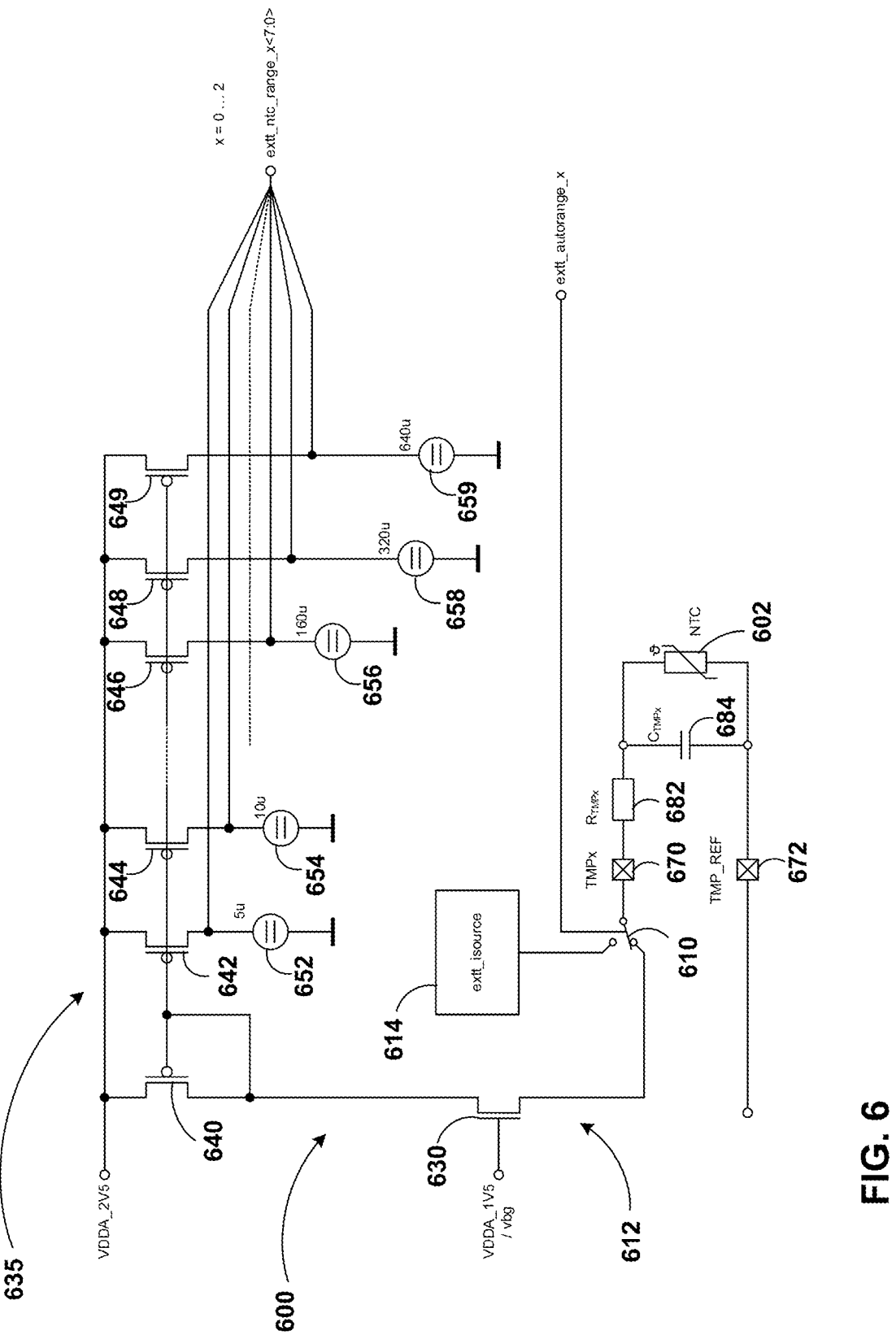

FIGS. 5 and 6 are circuit diagrams consistent with this disclosure. FIGS. 5 and 6 are both consistent with the example of FIG. 3, although the ADC associated with the current measurement is not specifically shown in FIGS. 5 and 6. Temperature sensitive resistor 502, 602 of FIGS. 5 and 6 may be similar to temperature sensitive resistor 302 of FIG. 3 and may operate as set forth above. Switch circuit 510, 610 of FIGS. 5 and 6 may be similar to switch circuit 310 of FIG. 3 and may operate as set forth above. Current source 514, 614 of FIGS. 5 and 6 may be similar to current source of FIG. 3 and may operate as set forth above. Reference voltage supply circuit 312 may generally correspond to reference voltage supply circuits 512, 612 of FIGS. 5 and 6, but FIGS. 5 and 6 provide additional details and examples of the reference voltage supply circuit. FIGS. 5 and 6 also illustrate additional elements (e.g., current mirrors 535, 635), which may be used for the auto ranging step.

The example of FIG. 5 includes a temperature measurement circuit 500 is configured to measure a temperature-dependent voltage drop over a temperature sensitive resistor 502. As with other examples described herein, temperature sensitive resistor 502 may comprise a negative temperature coefficient thermistor used to define temperature as a function of its resistance. With known voltages and currents, the resistance of temperature sensitive resistor 502 can be determined based on Ohms law. In the example shown in FIG. 5, a filtering capacitor (i.e., capacitive filter 584) is positioned in parallel with temperature sensitive resistor 502 and an additional filtering resistor 582 is positioned in series with temperature sensitive resistor 502, which is desirable for many situations and applications. Temperature sensitive resistor 502 and optional filters (capacitive filter 520 and resistive filter 582) may be connected to the temperature measurement circuit via connection pins 570, 572 or other electrical connections.

As shown in FIG. 5, a reference voltage supply circuit 512 may be configured to supply a reference voltage, which may be pre-defined. Reference voltage supply circuit 512 may comprise a regulated buffer circuit that includes transistor 530, a amplifier circuit 532 and a resistor 534 in the regulation loop, which serves to pull down the regulation voltage. Circuit 500 also includes a current source 514 configured to supply a temperature measurement current, which can be defined by the process performed by circuit 500. A switch circuit 510 may be configured to select between reference voltage supply circuit 512 and current source 514. For example, circuit 500 may be configured to control switch circuit 510 to deliver a reference voltage from reference voltage supply circuit 512 to temperature sensitive resistor 502 and determine an auto-ranging current through temperature sensitive resistor 502 while the reference voltage from reference voltage supply circuit 512 is delivered to temperature sensitive resistor 502. Circuit 500 can then determine the temperature measurement current based on the auto-ranging current through temperature sensitive resistor 502 while the reference voltage from reference voltage supply circuit 512 is delivered to temperature sensitive resistor 502.

In the example of FIG. 5, circuit 500 further includes a current mirror circuit 535 with multiple outputs that is configured to mirror the auto-ranging current. The current mirror with multiple outputs 535 may comprise a first transistor 540, and a plurality of second transistors 542, 544, 546, 548, 549 connected to current sources 552, 554, 556, 558, 559 that source different current levels. Current mirror circuit 535 mirrors the current through temperature sensitive resistor 502 and depending on the mirrored current, second transistors 542, 544, 546, 548, 549 are enabled to output the current levels of one or more current sources 552, 554, 556, 558, 559, which provides an automatically generated estimate of the auto-ranging current. For example, first transistor 540 may comprise a "mother" transistor of the multi-output current mirror 535, and second transistors 542, 544, 546, 548, 549 may comprise different "child" transistors of the multi-output current mirror 535. The voltage drop across first transistor 540 defines the drain current of the second transistors 542, 544, 546, 548, 549. The different current levels defined by current sources 552, 554, 556, 558, 559 may represent different multiplication factors. For example, a higher auto-ranging current causes more second transistors 542, 544, 546, 548, 549 to get enabled, thereby causing more of current sources 552, 554, 556, 558, 559 to output their current levels. The example shown in FIG. 5 provides 8 NTC ranges from ntc_range_0 to ntc_range_7. Of course, the overall current range being monitored, as well as the resolution of each of the steps (i.e., multiplication factors) associated with each current source can be changed in other examples.

The highest output 590 of the current mirror 535 may correspond to the NTC range that defines the temperature measurement current, which is based on the "mirrored" auto-ranging current through temperature sensitive resistor 502. Upon determining the temperature measurement current, circuit 500 may then tune current source 514 to deliver the defined temperature measurement current. Moreover, circuit 500 may control switch circuit 510 to cause current source 514 to deliver the temperature measurement current to temperature sensitive resistor 502, and circuit 500 can measure the temperature-dependent voltage drop over the temperature sensitive resistor 502 while the temperature measurement current is delivered to the temperature sensitive resistor, e.g., using an ADC like that of FIG. 3 (not shown in FIG. 5).

The example of FIG. 6 includes a temperature measurement circuit 600 configured to measure a temperature-dependent voltage drop over a temperature sensitive resistor 602. Circuit 600 of FIG. 6 is very similar to circuit 500 of FIG. 5 in many respects. Therefore, many details of FIG. 6 will not be repeated insofar as circuit 600 operates like circuit 500 in many respects. Current mirror 635 is similar to current mirror 535 and operates in the manner described above. Transistors 642, 644, 646, 648, 649 are similar to transistors 542, 544, 546, 548, 549 and operate in the manner described above. Current sources 652, 654, 656, 658, 659 are similar to current sources 552, 554, 556, 558, 559 and operate in the manner described above. Temperature sensitive resistor 602 is similar to temperature sensitive resistor 502 and operate in the manner described above. Capacitive filter 684 and resistive filter 682 are similar to capacitive filter 584 and resistive filter 582, and pins 670, 672 are similar to pins 570, 572. Current source 614 is similar to current source 514 and switch circuit 610 is similar to switch circuit 510. Output 690 is similar to output 590 insofar as it corresponds to the NTC range that defines the temperature measurement current, which is based on the "mirrored" auto-ranging current through temperature sensitive resistor 602.

The circuit of FIG. 6 operates similarly to the operation of the circuit of FIG. 5. However, the reference voltage supply circuit 612 of FIG. 6 is slightly different and simplified relative to the reference voltage supply circuit 512 of FIG. 6. For example, whereas reference voltage supply circuit 512 of FIG. 5 comprises a regulated buffer circuit, reference voltage supply circuit 612 of FIG. 6 comprises a transistor 630 arranged as a source follower that is directly connected to an internal supply domain. The simplified solution of FIG. 6 eliminates the need for a regulation loop and amplifier circuit 532. The solution of FIG. 5 may provide better accuracy in the range prediction step by providing a more accurate pre-defined voltage, but the solution in FIG. 6 may be acceptable for many situations, with reduced complexity. In other words, the circuit concepts of FIG. 6 may render to range-prediction feature slightly less accurate relative to the approach of FIG. 5, but the circuit of FIG. 6 may be desirable in some situations to help to simplify the circuit implementation and reduce cost of production.

The auto ranging features of this disclosure can improve performance of temperature measurement circuits. In a first step an external NTC resistor (e.g., a thermistor) is connected to the reference voltage supply circuit. In some examples, the reference voltage supply circuit may comprise a bandgap reference voltage and a regulated buffer circuit, which copies the reference voltage to the thermistor (including a filter capacitor). The auto-ranging current, which is required to generate the reference voltage on the buffer output (equals the current flowing through the thermistor) and this auto-ranging current can be sensed by a current mirror circuit and replicated with difference multiplication factors. Furthermore, the current replications may be compared to well defined current thresholds to generate a (thermometer coded) range indication signal for the control logic.

In the next step the reference voltage buffer is disconnected from the thermistor and a current source delivers the temperature measurement current to the thermistor, i.e., the temperature measurement current determined based on the mirrored auto-ranging current identified in the first step.

Using the concepts of this disclosure, in various examples, one or more of the following advantages can be achieved:

1) The current range may be chosen in an optimum way and hence the ADC measurement can be performed at a voltage with maximum precision 2) Only a single ADC measurement may be needed to accomplish a valid temperature measurement. Time consuming range adjustments that may be needed in conventional approaches can be eliminated.

3) The final evaluation voltage will be very close to the buffer reference voltage that was used during the auto-ranging phase. Since there is only a minimum change of NTC evaluation voltage between the auto-ranging operation and the actual measurement, the settling time in the current measurement can be significantly shorter compared to other approaches.

In some examples, the auto-ranging mechanism may help to ensure that each measurement yields a valid result in a desirable measurement range. With other approaches, the measurement range can be violated from time to time, in which case the system may be without a result for some time and may wait until the next measurement with an adjusted range. Such delay can be unacceptable for some applications where safety is paramount. Especially in the case of system faults (e.g., open load, or short-to-ground of a sensor wire) several range transitions can be necessary with conventional approaches, and it could take longer than the system fault tolerant time interval to get a correct error diagnosis information. The described circuits can overcome these shortcomings of conventional approaches.

FIG. 7 is a flow diagram consistent with techniques of this disclosure. FIG. 7 will be described from the perspective of circuits 300, 500, 600 of FIGS. 3, 5, and 6, although the method may be performed by other circuits.

As shown in FIG. 7, circuit 300, 500, 600 controls switch circuit 310, 510, 610 to select reference voltage supply circuit 312, 512, 612, which delivers a reference voltage to a temperature sensitive resistor 302, 502, 602 in a first instance of time (701). The first instance of time may correspond to a range prediction shown in FIG. 4. Circuit 300, 500, 600 then determines an auto-ranging current through the temperature sensitive resistor 302, 502, 602 while the reference voltage is delivered in a first instance of time (702). For example, circuit 300, 500, 600 may include a current mirror circuit 535, 635 with multiple outputs (not shown in FIG. 3), which may be arranged to mirror the auto-ranging current. The level of auto-ranging current determines the outputs from the multi-output current mirror circuits 535, 635 to automatically provide an estimation of the auto-ranging current, i.e., a range level of the "mirrored" auto-ranging current. Circuit 300, 500, 600 can then determine a temperature measurement current based on the auto-ranging current (703), e.g., as a current corresponding to the determined range level.

Upon determining the temperature measurement current based on the auto-ranging current (703), circuit 300, 500, 600 tunes current source 314, 514, 614 to source the auto-ranging current (704). Circuit 300, 500, 600 then controls switch circuit 310, 510, 610 to select current source 314, 514, 614, which delivers the determined temperature measurement current to temperature sensitive resistor 302, 502, 602 in a second instance of time (705). The second instance of time may correspond to a current based measurement shown in FIG. 4. An ADC 316 (not shown in FIGS. 5 and 6) measures a temperature-dependent voltage drop over the temperature sensitive resistor while the temperature measurement current is delivered in the second instance of time (706).

The techniques described in this disclosure may be implemented, at least in part, in circuitry, hardware, software, firmware or any combination thereof. For example, various aspects of the described techniques may be implemented within one or more logical elements, processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

It may also be possible for one or more aspects of this disclosure to be performed in software, in which case those aspects of the techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, or other computer readable media.

The following clauses may illustrate one or more aspects of the disclosure.

Clause 1—A temperature measurement circuit configured to measure a temperature-dependent voltage drop over a temperature sensitive resistor, the temperature measurement circuit comprising: a reference voltage supply circuit configured to supply a reference voltage; a current source configured to supply a temperature measurement current; and a switch circuit configured to select between the reference voltage supply circuit and the current source, wherein the temperature measurement circuit is configured to: control the switch circuit to deliver the reference voltage to the temperature sensitive resistor; determine an auto-ranging current through the temperature sensitive resistor while the reference voltage is delivered to the temperature sensitive resistor; determine the temperature measurement current based on the auto-ranging current; control the switch circuit to deliver the temperature measurement current to the temperature sensitive resistor; and measure the temperature-dependent voltage drop over the temperature sensitive resistor while the temperature measurement current is delivered to the temperature sensitive resistor.

Clause 2—The temperature measurement circuit of clause 1, wherein the temperature measurement circuit comprises a battery cell management circuit and the temperature sensitive resistor is associated with one or more battery cells of the battery cell management circuit.

Clause 3—The temperature measurement circuit of clause 1 or 2, further comprising an ADC, wherein the ADC is configured to: measure the temperature-dependent voltage drop over the temperature sensitive resistor while the temperature measurement current is delivered to the temperature sensitive resistor; and output a digital value indicative of the temperature-dependent voltage drop.

Clause 4—The temperature measurement circuit of any of clauses 1-3, further comprising a current mirror configured to determine the auto-ranging current through the temperature sensitive resistor while the reference voltage is delivered to the temperature sensitive resistor.

Clause 5—The temperature measurement circuit of clause 4, wherein the current mirror is configured with a plurality of outputs that determine the auto-ranging current through the temperature sensitive resistor.

Clause 6—The temperature measurement circuit of any of clauses 1-5, wherein the reference voltage supply circuit comprise a regulated buffer circuit.

Clause 7—The temperature measurement circuit of any of clauses 1-5, wherein the reference voltage supply circuit comprises a transistor arranged as a source follower.

Clause 8—A method of measuring a temperature-dependent voltage drop over a temperature sensitive resistor, the method comprising: delivering a reference voltage to the temperature sensitive resistor in a first instance of time; determining an auto-ranging current through the temperature sensitive resistor while the reference voltage is delivered to the temperature sensitive resistor; determining a temperature measurement current based on the auto-ranging current; delivering the temperature measurement current to the temperature sensitive resistor in a second instance of time, wherein the second instance of time is after the first instance of time; and measuring the temperature-dependent voltage drop over the temperature sensitive resistor while the temperature measurement current is delivered to the temperature sensitive resistor.

Clause 9—The method of clause 8, wherein delivering a reference voltage to the temperature sensitive resistor in the first instance of time comprises controlling a switch circuit to select the reference voltage; and wherein delivering the temperature measurement current to the temperature sensitive resistor in a second instance of time comprises controlling the switch circuit to select a current source configured to deliver the temperature measurement current.

Clause 10—The method of clause 8 or 9, wherein the method is performed by a battery cell management circuit.

Clause 11—The method of any of clauses 8-10, further comprising: measuring the temperature-dependent voltage drop over the temperature sensitive resistor via an ADC; and outputting, via the ADC, a digital value indicative of the temperature-dependent voltage drop.

Clause 12—The method of any of clauses 9-11, wherein determining an auto-ranging current includes mirroring, via a current mirror, the auto-ranging current through the temperature sensitive resistor while the reference voltage is delivered to the temperature sensitive resistor.

Clause 13—The method of clause 12, wherein the current mirror includes a plurality of outputs that determine the auto-ranging current through the temperature sensitive resistor.

Clause 14—A system comprising: a plurality of battery cells; and a plurality of battery management circuits configured to manage different subsets of the plurality of battery cells, wherein each of the battery management circuits includes one or more temperature measurement circuits, wherein each of the temperature measurement circuits is configured to measure a temperature-dependent voltage drop over a temperature sensitive resistor and wherein each of the temperature measurement circuits comprises: a reference voltage supply circuit configured to supply a reference voltage; a current source configured to supply a temperature measurement current; and a switch circuit configured to select between the reference voltage supply circuit and the current source, wherein each of the temperature measurement circuits is configured to: control the switch circuit to deliver the reference voltage to the temperature sensitive resistor; determine an auto-ranging current through the temperature sensitive resistor while the reference voltage is delivered to the temperature sensitive resistor; determine the temperature measurement current based on the auto-ranging current; control the switch circuit to deliver the temperature measurement current to the temperature sensitive resistor; and measure the temperature-dependent voltage drop over the temperature sensitive resistor while the temperature measurement current is delivered to the temperature sensitive resistor.

Clause 15—The system of clause 14, wherein each of the battery management circuits includes a plurality of the temperature measurement circuits.

Clause 16—The system of clause 15, further comprising a plurality of temperature sensitive resistors for each of the battery management circuits, wherein each of the plurality of the temperature measurement circuits is paired with one of the plurality of temperature sensitive resistors.

Clause 17—The system of clause 16, further comprising a plurality of filtering capacitors, wherein each of the plurality of the filtering capacitors is arranged in parallel with one of the plurality of temperature sensitive resistors.

Clause 18—The system of any of clauses 14-17, wherein each of the temperature measurement circuits comprises an ADC, wherein the ADC is configured to: measure the temperature-dependent voltage drop over the temperature sensitive resistor while the temperature measurement current is delivered to the temperature sensitive resistor; and output a digital value indicative of the temperature-dependent voltage drop.

Clause 19—The system of any of clauses 14-18, wherein each of the temperature measurement circuits comprises a current mirror configured to determine the auto-ranging current through the temperature sensitive resistor while the reference voltage is delivered to the temperature sensitive resistor.

Clause 20—The system of clause 19, wherein the current mirror is configured with a plurality of outputs that determine the auto-ranging current through the temperature sensitive resistor.

Various aspects and examples have been described in this disclosure. These and other aspects and examples are within the scope of the following claims.

The invention claimed is:

1. A temperature measurement circuit configured to measure a temperature-dependent voltage drop over a temperature sensitive resistor, the temperature measurement circuit comprising:

a reference voltage supply circuit configured to supply a reference voltage;

a first current source configured to supply a temperature measurement current;

a current mirror comprising a plurality of outputs, wherein the current mirror includes a first transistor and a plurality of second transistors connected to a plurality of second current sources that source different current levels in the current mirror to the plurality of outputs; and a switch circuit configured to select between the reference voltage supply circuit and the first current source, wherein the temperature measurement circuit is configured to:

control the switch circuit to deliver the reference voltage to the temperature sensitive resistor;

determine an auto-ranging current through the temperature sensitive resistor based on the plurality of outputs of the current mirror while the reference voltage is delivered to the temperature sensitive resistor, wherein the current mirror is configured to define the auto-ranging current through the temperature sensitive resistor based on the plurality of outputs;

determine the temperature measurement current based on the auto-ranging current;

control the switch circuit to deliver the temperature measurement current to the temperature sensitive resistor; and measure the temperature-dependent voltage drop over the temperature sensitive resistor while the temperature measurement current is delivered to the temperature sensitive resistor.

2. The temperature measurement circuit of claim 1, wherein the temperature measurement circuit comprises a battery cell management circuit and the temperature sensitive resistor is associated with one or more battery cells of the battery cell management circuit.

3. The temperature measurement circuit of claim 1, further comprising an analog-to-digital converter (ADC), wherein the ADC is configured to:

measure the temperature-dependent voltage drop over the temperature sensitive resistor while the temperature measurement current is delivered to the temperature sensitive resistor; and output a digital value indicative of the temperature-dependent voltage drop.

4. The temperature measurement circuit of claim 1, wherein the reference voltage supply circuit comprises a regulated buffer circuit.

5. The temperature measurement circuit of claim 1, wherein the reference voltage supply circuit comprises a transistor arranged as a source follower.

6. A method of measuring a temperature-dependent voltage drop over a temperature sensitive resistor via a temperature measurement circuit that includes:

a reference voltage supply circuit configured to supply a reference voltage;

a first current source configured to supply a temperature measurement current;

a current mirror comprising a plurality of outputs, wherein the current mirror includes a first transistor and a plurality of second transistors connected to a plurality of second current sources that source different current levels in the current mirror to the plurality of outputs; and a switch circuit configured to select between the reference voltage supply circuit and the first current source, the method comprising:

delivering a reference voltage to the temperature sensitive resistor in a first instance of time;

determining an auto-ranging current through the temperature sensitive resistor based on the plurality of outputs while the reference voltage is delivered to the temperature sensitive resistor, wherein the current mirror is configured to define the auto-ranging current through the temperature sensitive resistor based on the plurality of outputs;

determining a temperature measurement current based on the auto-ranging current;

delivering the temperature measurement current to the temperature sensitive resistor in a second instance of time, wherein the second instance of time is after the first instance of time; and measuring the temperature-dependent voltage drop over the temperature sensitive resistor while the temperature measurement current is delivered to the temperature sensitive resistor.

7. The method of claim 6, wherein delivering a reference voltage to the temperature sensitive resistor in the first instance of time comprises controlling a switch circuit to select the reference voltage; and wherein delivering the temperature measurement current to the temperature sensitive resistor in a second instance of time comprises controlling the switch circuit to select a current source configured to deliver the temperature measurement current.

8. The method of claim 6, wherein the method is performed by a battery cell management circuit.

9. The method of claim 6, further comprising:

measuring the temperature-dependent voltage drop over the temperature sensitive resistor via an analog-to-digital converter (ADC); and outputting, via the ADC, a digital value indicative of the temperature-dependent voltage drop.

10. A system comprising:

a plurality of battery cells; and a plurality of battery management circuits configured to manage different subsets of the plurality of battery cells, wherein each of the battery management circuits includes one or more temperature measurement circuits, wherein each of the temperature measurement circuits is configured to measure a temperature-dependent voltage drop over a temperature sensitive resistor and wherein each of the temperature measurement circuits comprises:

a reference voltage supply circuit configured to supply a reference voltage;

a first current source configured to supply a temperature measurement current;

a current mirror comprising a plurality of outputs, wherein the current mirror includes a first transistor and a plurality of second transistors connected to a plurality of second current sources that source different current levels in the current mirror to the plurality of outputs; and a switch circuit configured to select between the reference voltage supply circuit and the first current source, wherein each of the temperature measurement circuits is configured to:

control the switch circuit to deliver the reference voltage to the temperature sensitive resistor;

determine an auto-ranging current through the temperature sensitive resistor based on the plurality of outputs of the current mirror while the reference voltage is delivered to the temperature sensitive resistor, wherein the current mirror is configured to define the auto-ranging current through the temperature sensitive resistor based on the plurality of outputs;

determine the temperature measurement current based on the auto-ranging current;

control the switch circuit to deliver the temperature measurement current to the temperature sensitive resistor; and measure the temperature-dependent voltage drop over the temperature sensitive resistor while the temperature measurement current is delivered to the temperature sensitive resistor.

11. The system of claim 10, wherein each of the battery management circuits includes a plurality of the temperature measurement circuits.

12. The system of claim 11, further comprising a plurality of temperature sensitive resistors for each of the battery management circuits, wherein each of the plurality of the temperature measurement circuits is paired with one of the plurality of temperature sensitive resistors.

13. The system of claim 12, further comprising a plurality of filtering capacitors, wherein each of the plurality of the filtering capacitors is arranged in parallel with one of the plurality of temperature sensitive resistors.

14. The system of claim 10, wherein each of the temperature measurement circuits comprises an analog-to-digital converter (ADC), wherein the ADC is configured to:

measure the temperature-dependent voltage drop over the temperature sensitive resistor while the temperature measurement current is delivered to the temperature sensitive resistor; and output a digital value indicative of the temperature-dependent voltage drop.

* * * * *